United States Patent [19]

Mellado et al.

[11] Patent Number: 5,796,731
[45] Date of Patent: Aug. 18, 1998

[54] MULTILINE PCM INTERFACE FOR SIGNAL PROCESSING

[75] Inventors: Augusto Guilabert Mellado, Madrid; José Antonio Vale Porben, Malaga; Jorge Gonzalez Martinez, Torremolinos, all of Spain

[73] Assignee: Alcatel NV, Netherlands

[21] Appl. No.: 579,406

[22] Filed: Dec. 27, 1995

[30] Foreign Application Priority Data

Dec. 30, 1994 [ES] Spain ................. 9402697

[51] Int. Cl.$^6$ ................................. H04J 3/02
[52] U.S. Cl. ............... 370/362; 370/286; 375/242; 375/244; 379/61
[58] Field of Search ................. 370/362, 345, 370/289, 286; 375/243, 244, 245, 242; 379/61; 364/514 A

[56] References Cited

U.S. PATENT DOCUMENTS

| | | | |
|---|---|---|---|
| 4,777,633 | 10/1988 | Fletcher et al. | 370/345 |
| 5,317,522 | 5/1994 | Bonet et al. | 375/245 |
| 5,555,287 | 9/1996 | Gulick et al. | 379/61 |
| 5,600,674 | 2/1997 | Bonet et al. | 375/244 |

OTHER PUBLICATIONS

Catalog "Semiconductors for Telecom Systems", 1993, reference IC03, published by Philips Semiconductors, p. 472.

*Primary Examiner*—Douglas W. Olms
*Assistant Examiner*—Shick Hom
*Attorney, Agent, or Firm*—Ware, Fressola, Van Der Sluys & Adolphson LLP

[57] ABSTRACT

A multiline PCM interface for signal processing is of particular application in cordless digital telephony, type DECT, with echo cancelling and ADPCM type voice encoding. The interface incorporates a set of ADPCM encoders (COD) and ADPCM decoders (DEC), digital-to-analogue (D/A) converters and analogue-to-digital converters (A/D). The outputs of the ADPCM decoders (DEC) and the analogue-to-digital converters (A/D) are joined to form a PCM output bus (BPO), the inputs of the digital-to-analogue (D/A) converters and ADPCM encoders (COD) are joined together to form a PCM input bus (PI). The interface also includes signal processing means (MSP) which receive data bursts from the PCM output bus (BPO) and applies these same bursts to the PCM input bus (PI) with a delay of one frame and echo-free. A synchronism generator (SYGEN) allocates consecutive time slots to converters involved in the same conversation, which therefore employ the same signal processor (DSP) to perform associated conference operations.

6 Claims, 4 Drawing Sheets

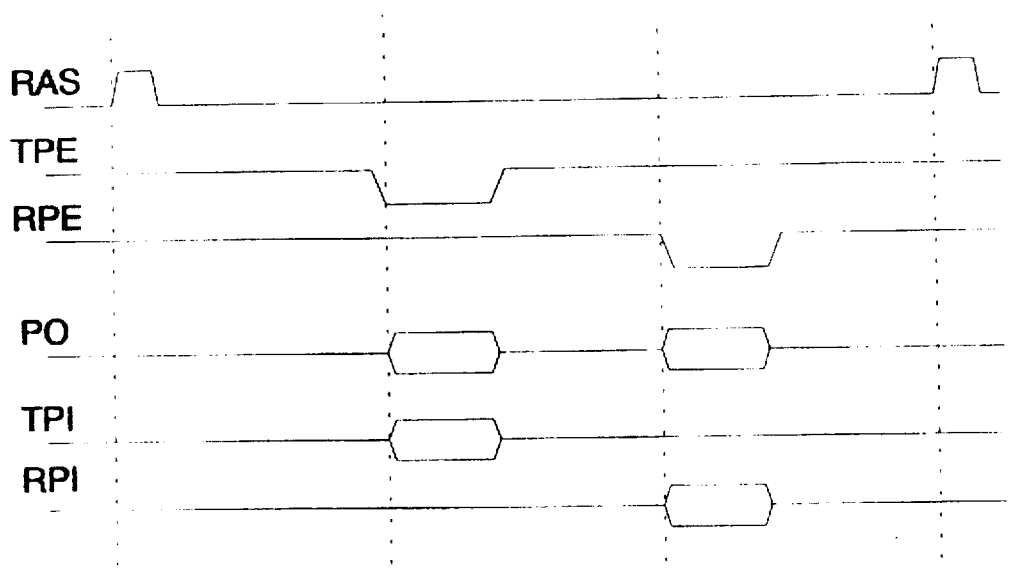
FIG. 3  Prior Art
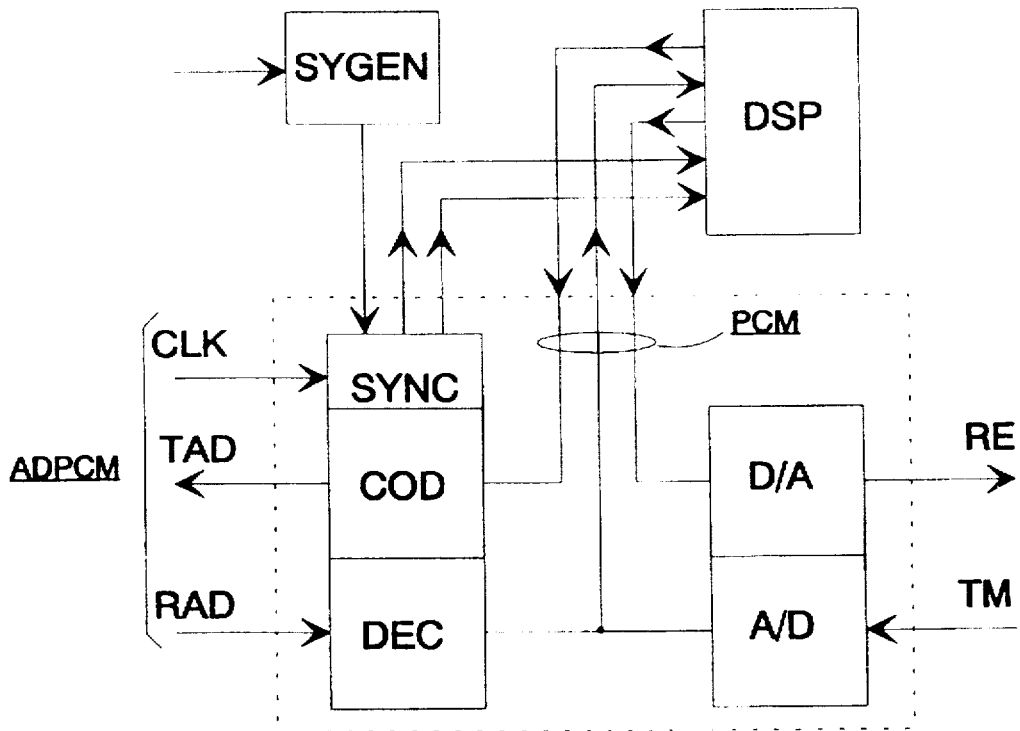
FIG. 4

MULTILINE PCM INTERFACE FOR SIGNAL PROCESSING

TECHNICAL FIELD

This invention concerns the interface employed in a branch telephone exchange with DECT technology, which permits the control of a number of outgoing lines connected to a network of higher order, for example the public switched telephone network, and/or lines to which telephone type terminals are connected.

This branch exchange permits communication to be established between DECT type cordless terminals or with hardwired lines and outgoing lines.

In this interface a PCM type linear coding is employed, permitting signal processing like, for example, echo cancelling and conference facility.

BACKGROUND OF THE INVENTION

Present cordless telephone systems make use of digital coding techniques, for example DECT uses ADPCM at 32 kb/s. This type of coding, of a non-linear nature, is achieved using 14-bit linear PCM coding of samples of a signal in the audio frequency band.

There are devices that perform these ADPCM coding and decoding processes of analogue signals and which have been specially developed for systems like DECT. For example, the Philips device PCD 5032, as indicated on page 472 of their catalogue "Semiconductors for Telecom Systems", 1993, reference IC03, published by Philips Semiconductors, performs the functions of A/D and D/A conversion, ADPCM coding and decoding, and other functions related to synchronisation, as well as programming of certain functionalities.

Although the detailed operation of this device is explained in the catalogue mentioned, the blocks that are related to the invention described below are basically those for ADPCM coding and decoding, A/D and D/A conversion, and generation of synchronisation signals.

These devices basically offer a single common serial output of PCM data coming from the ADPCM decoder in the receive path and from the A/D converter in the transmit path; a serial PCM data input for application to the D/A converter in the receive path and another serial PCM data input for application to the ADPCM coder in the transmit path. There is also a signal which indicates code presence in the transmit path, which is activated with a low level whenever the data sample for transmitting coming from the A/D converter appears, this interval coinciding with that of data reading in the ADPCM coder. There is also a signal that indicates code presence in reception which, in like manner, is activated at a low level when the received data sample coming from the ADPCM decoder appears, coinciding with the data read time in the D/A converter.

When used in base stations, bus structures can be employed because the outputs have a high impedance when they are inactive.

In the event of any type of signal processing being required (for example, echo cancelling in base station communications channels), it would be necessary, as stated in the publication mentioned, to mount a device for data processing between the serial PCM data output and the serial PCM data inputs, for application to the ADPCM coder in the transmit path and to the D/A converter in the receive path.

The consequence of this is that, for example, in a multiline base station that needs echo cancelling in all channels, it would initially be necessary to have a number of busses (of a single wire) equal to the number of devices of this type, in order to ensure that there are no overlap of signals in any situation, regardless of the time slot in which each device is used.

SUMMARY OF THE INVENTION

The multiline interface serves to manage a set of audio frequency channels with ADPCM coding and which require signal processing in an intermediate stage in which the analogue signals are coded in ADPCM, and vice versa. To achieve this, use is made of a set of bidirectional line coding devices that include ADPCM coders, ADPCM decoders, analogue-to-digital converters, digital-to-analogue converters, signal processing means and a synchronism generator; and in which all the output signals from the ADPCM decoders and from the analogue-to-digital converters are joined together in a single PCM output bus. All the input signals of the ADPCM encoders, like the input signals of the digital-to-analogue converters, are also joined together in a single PCM input bus; and, finally, all the code presence indicator signals are also joined together to form a code presence indicator bus.

The synchronism generator determines, by means of a generator circuit and synchronisation pulse programmable routing, which time slot is allocated to each line coder, such that those that are involved in a given conversation make use of two consecutive time slots in the same signal processor. The timing pattern used for the synchronisation pulses prevents data collisions in the busses mentioned above.

BRIEF DESCRIPTION OF THE DRAWINGS

Below is given a fuller explanation of the invention in the description of an implementation based on the figures attached, in which:

FIG. 3 shows the timing diagram of the signals involved in the data transmission and reception processes of the commercially available device already mentioned, FIG. 4 shows the block diagram used in a configuration that requires signal processing, for a single channel.

BEST MODE FOR CARRYING OUT THE INVENTION

This invention has been implemented in a residential type base station with DECT technology. The base station in question performs the functions of a private branch exchange in which a number of outgoing lines permit wireless access for a set of cordless terminals so that the latter can establish connections between one another or with subscribers not connected to this branch exchange. To do this, it is connected through outside lines to the public telephone network.

Figure 1:
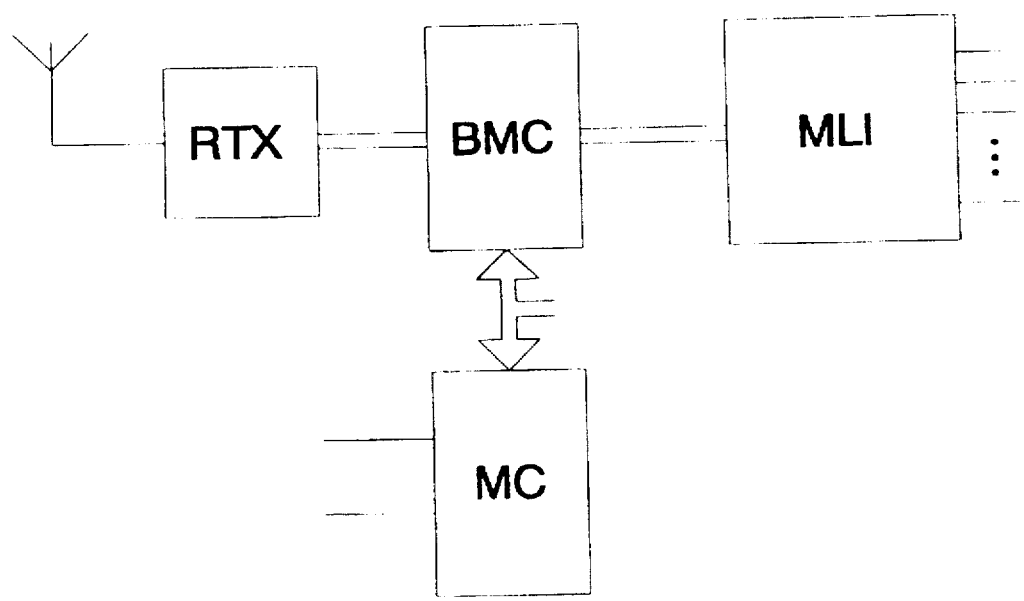
FIG. 1 shows the general block diagram of a cordless communications base station in which the invention has been incorporated.

The base station basically has a block diagram as shown in FIG. 1. It consists of a radio transceiver RTX in DECT technology, a burst controller BMC, a microcontroller MC and a multiline interface MLI that performs the conversions of analogue to ADPCM coding in the transmit path and from ADPCM to analogue in the receive path. In both processes it carries out an intermediate PCM conversion.

The radio transceiver RTX includes a transmitter, a receiver and a frequency synthesizer. The transmitter serves to transmit, via radio, data bursts coming from the burst controller BMC in the radiofrequency channel determined by the synthesizer. The receiver receives, via radio, also in the radiofrequency channel determined by the synthesizer, the bursts proceeding from the terminals with which it is in communication; it also obtains other types of information, such as received field strength, etc.

The data bursts are located in time slots in accordance with the air interface of the DECT standard, that is, 12 time slots for transmission and an identical number for reception, and 10 possible radiofrequency channels in the band allocated for this type of communication.

A single radio transceiver is capable of handling a maximum of 12 bidirectional channels although, for this, use can be made of the 10 available frequencies determined by the standard.

The burst controller BMC has several basic functions. In the first place, it serves to deliver the necessary timing signals so that the data bursts transmitted do so in the defined time slots. In addition, those that are received from the terminals also respect these timing signals, since they are synchronised with the corresponding base station.

It also has the task of composing the data bursts that are going to be transmitted by radio; that is, to the data coming from the ADPCM coders, it adds the control field and the header. In the receive path, and in similar fashion, it disassembles the received bursts, suppressing the header and separating the control and information fields, the latter being the one carrying the audio frequency channels and which have ADPCM coding.

The microcontroller MC serves to control the functions for external interfacing that are used for base station programming, data display, etc.

Finally, the multiline interface MLI serves to set up and control conversations on the side of the interface with the public communications network or with telephone terminals, accordingly. Among the different functions it performs are those of coding/decoding the ADPCM audio channel (voice, fax, etc.), first going through a PCM stage (in which functions of echo cancelling and conference are performed, and suitable time slots are allocated to the line coding devices that work with each audio channel). It also performs the function of ringing current generation and other control functions required for correct operation of the system which are not detailed as they do not form part of the invention.

Figure 2:
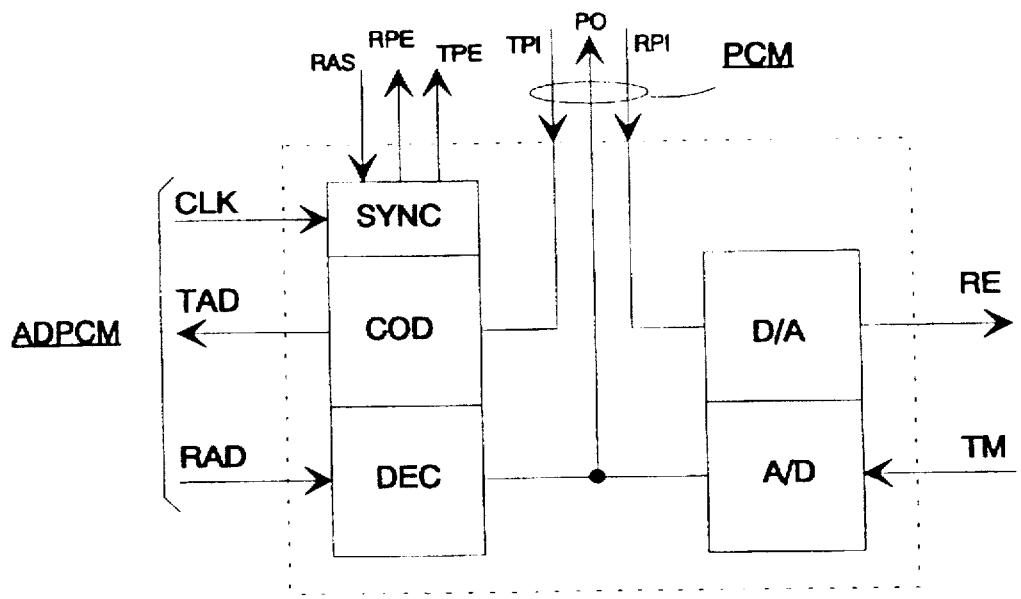
FIG. 2 shows the basic block diagram of a commercially available line coding device, employed in the invention.

To perform the ADPCM coding/decoding functions, the base station has standard, commercially available devices like the PCD 5032 of Philips which, in a simplified form, has a structure as shown in FIG. 2. Each device consists basically of an ADPCM decoder DEC that performs the conversion to PCM of bursts coming from the burst controller BMC, which are the receive side ADPCM signals RAD; an ADPCM coder COD that performs the conversion of PCM information bursts to ADPCM for applying to the burst controller BMC as ADPCM transmit signals TAD; an analogue-to-digital converter A/D which performs the conversion of analogue signals into PCM data, providing an analogue input channel TM in the audio frequency band; and a digital-to-analogue converter D/A that performs the conversion of PCM coded data into analogue output signals RE. The output signals, both from the analogue-to-digital converter A/D and from the ADPCM decoder, are joined internally. It also has a synchronisation module SYNC to determine when and what signals are to be activated at any given moment.

All the digital signals are precisely timed for reading the input signals and for generating output signals. This is shown in FIG. 3, where the timing diagrams of the indicated signals can be seen according to the manufacturer's information for the device.

During the ADPCM/PCM conversion, observe that the data transfer processes in both directions, transmit and receive, are initiated by the rising edge of the ADPCM synchronisation pulses RAS. When 163 clock cycles have elapsed, the serial PCM data appear (16 bits), arranged from greater to lesser weighting, at the PCM data output terminal PO, coming from the analogue-to-digital converter A/D which performs the conversion to digital of the audio signal to be transmitted TM. Simultaneously, the input terminal TPI of the ADPCM coder COD reads the first 14 bits at the same rate as the device clock CLK. While this process lasts, a PCM transmit indication signal TPE takes a low level to indicate this event.

After another 81 clock cycles have elapsed, and in a manner similar to that already described, the serial PCM data appear (16 bits), arranged from greater to lesser weighting, at the PCM data output terminal PO, coming from the ADPCM decoder DEC; simultaneously, the input terminal RPI of the digital-to-analogue converter D/A reads the first 14 bits and performs the conversion to analogue output signals RE; a PCM receive indication signal RPE also takes a low level to indicate this new event. After another 188 clock cycles have elapsed, the device is in condition to recommence the reception of the ADPCM synchronisation pulses RAS.

In this case digital signal processing is done, consisting of performing, in each channel, the corresponding echo cancelling. As this is a linear process, it cannot be done on ADPCM samples and has to be done on the PCM samples coming from the analogue-to-digital converter A/D in the transmit path and on those coming from the ADPCM decoder DEC in the receive path, as can be seen in FIG. 4. In this way, and in order to maintain the above indicated timing, the bits read by the ADPCM encoder COD in one path and by the digital-to-analogue converter D/A in the other, come from a signal processor DSP that performs the echo cancelling processes on the PCM bursts read in the previous frame period. There is also a synchronism generator SYGEN that generates the ADPCM synchronisation pulses RAS for initialising the data conversion process in both directions of transmission.

Figure 5:
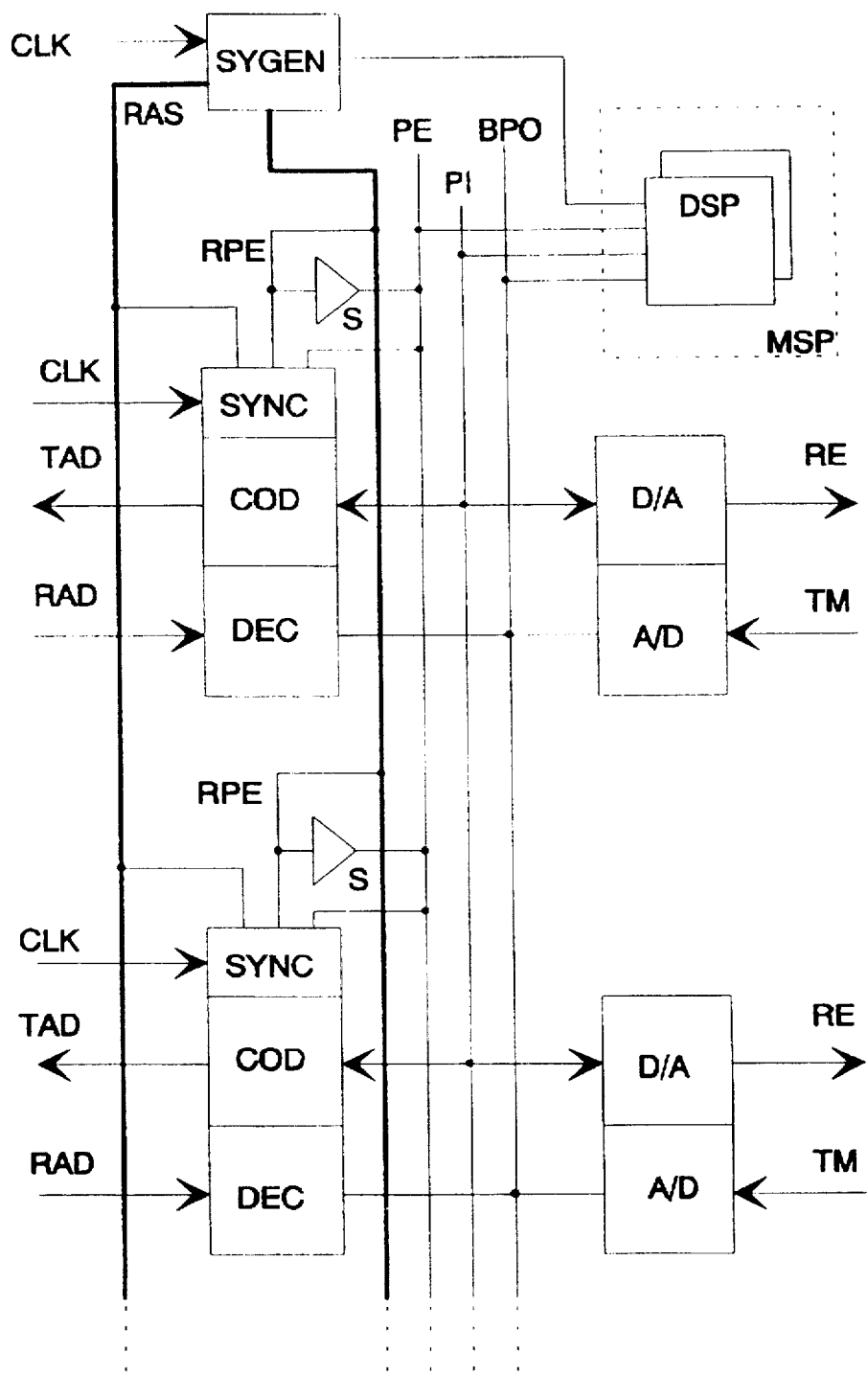
FIG. 5 shows the multiline configuration which incorporates the echo cancelling functionality.

For the case of a multiline system such as this being considered, the interface of the implementation described here and shown in FIG. 5, can consist of four or six PCD 5032 devices, like the one described, which manage four audio frequency bidirectional channels. Each one of half of them is used to connect a telephone set and the rest serve as outgoing lines into a network of higher order, for example, the public switched telephone network (though the number of inside and outside lines can be interchanged as long as they add to six).

The outputs of all the analogue-to-digital converters A/D and of all the ADPCM decoders DEC (which are already joined internally) are joined together to form a single serial PCM data output bus BPO that is applied to signal processing means MSP.

The inputs of all the ADPCM coders TPI and the RPI inputs of all the digital-to-analogue converters D/A are joined externally to form, in a similar manner, a serial PCM data input bus PI that is also connected to the signal processing means MSP.

In the same way, the outputs of transmit code presence indication signal TPE and of receive code presence indication signal RPE (the latter after passing through a three-state follower S of all the PCD 5032 devices, are joined together to form a single-wire code presence indication bus PE. This is also connected to the signal processing means in order to indicate when it will receive new bursts of PCM coded bits via the output PCM bus BPO, and when it has to transmit to the PCM input bus PI, the equivalent burst of the same channel read from the previous frame and after having performed the echo cancelling process.

The synchronism signal generator SYGEN also carries out a time slot allocation for the channel coding PCD 5032 devices, for which it generates four synchronisation pulse signals FS1, FS2, FS3 and FS4, whereby each of these is sent, respectively, to one of the devices mentioned. In this way, these pulses determine which time slot is allocated to each device so that they carry out the conversions between the ADPCM-PCM data codings, and vice versa, for both directions of transmission.

Figure 6:
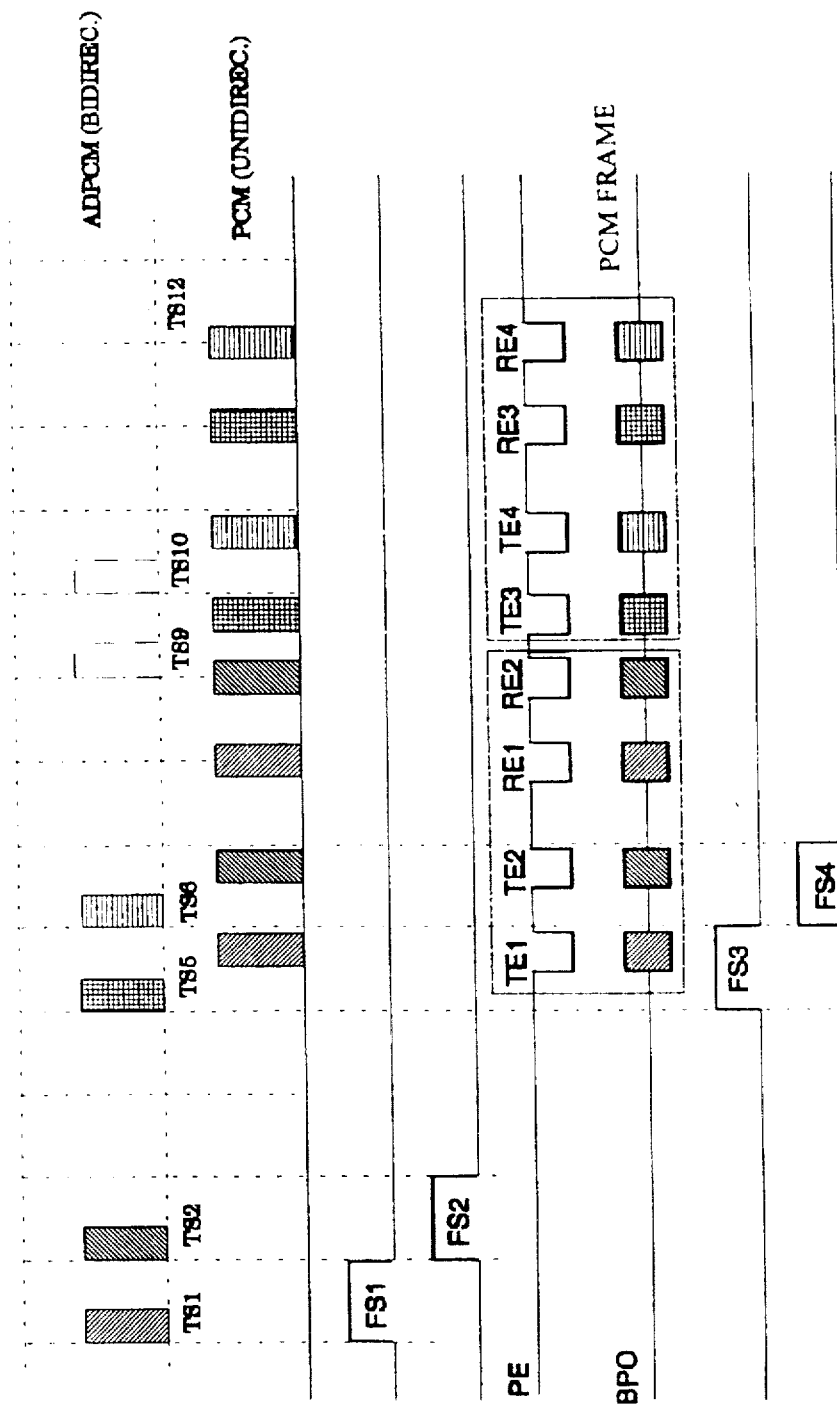
FIG. 6 shows the timing diagram of the signals present in the different devices in the multiline configuration of the previous figure.

This allocation process is based on seeking compatibility between the ADPCM frame structure at the output of the burst controller BMC, and the timings of the actual device employed, which makes use of a 3.465 MHz clock. FIG. 6 shows, in the top part, the structure of an ADPCM frame of the audio frequency channels for transmitting (or receiving) formed by 12 equal time slots and with a total duration of 125 µs. The allocation between slots in the ADPCM frame and in the DECT frame at the air interface is flexible and is done under the control of the burst controller itself.

With the same timing reference as before, the synchronisation pulses FS1 and FS2 are also shown in synchronism with slots 1 and 2 of the ADPCM interface and which are applied to the first and second devices. As a consequence of this, the conversion processes in transmission and reception of both are triggered.

When the first of the PCD 5032 devices receives the rising edge of the first synchronisation pulse FS1 and, consequently, when 163 clock cycles (47.164 µs) have elapsed, the 16 bits coming from the analogue-to-digital conversion of the audio signal that is going to be transmitted appear on the PCM output bus. When this occurs, the code presence indication bus PE takes the low level indicating the presence of these data, represented by the pulse TPE1.

These data are read by the signal processing means MSP which, simultaneously, injects the now processed 16 bits into the PCM input bus PI, corresponding to the same audio channel of the previous frame.

According to the timing described, 81 clock cycles later (224 clock cycles, or 64.8 µs, after the synchronisation pulse mentioned), the 16 bits coming from the ADPCM decoder DEC appear on the PCM input bus PI for the receive path and which, similarly, are read by the signal processing means MSP in order to proceed with their treatment. In a like fashion to that already indicated, in the code presence indication bus PE, a low level signal appears indicating the presence of these received bits, represented by the pulse RPE1, so that the signal processing means MSP inserts the processed bits of the same received audio frequency channel corresponding to the previous frame in the PCM input bus PI.

In the complete ADPCM coding and decoding process, the signals involved are only activated in certain time windows, which permits the insertion of other windows for more effective sharing of the busses employed. Thus, when the second PCD 5032 device receives the second synchronisation pulse FS2, similar to the first but with a delay of 10.4 µs with respect to it, the 16 bits corresponding to a new audio frequency signal appear on the PCM output bus BPO. This permits the insertion of two audio channels, as can also be seen in FIG. 6.

A third synchronisation pulse FS3 which is associated with slot 5 of the ADPCM interface (not with slot 3), the rising edge of which appears 41.23 µs after the first, is applied to a third PCD 5032 device so that the occupied periods of the PCM output bus BPO, of the code presence indication bus PE, and of the PCM input bus PI do not overlap with the previous ones.

Similarly a fourth synchronisation pulse FS4 is produced in association with slot 6 of the ADPCM interface, the rising edge of which occurs 10.4 µs after the edge of the third, in such a way that the instants of occupancy of the wires mentioned by a fourth device like those already mentioned, are interleaved with the instants of occupancy of these wires by the third device without any overlapping between them.

The signal processing means MSP are formed by two signal processors of the type DSP 77C25, each of which permits echo to be cancelled in two channels. One of these processors serves for the cancellation of echo in the first two devices, while the second serves for echo cancelling in the third and fourth devices.

Although this implementation does not make use of it, it is also possible to include two more devices which share the busses without producing overlapping between the signals coming from the different devices; to this end, the fifth and sixth synchronisation pulses should have their rising edge 41.23 µs after that of the third and fourth pulses respectively, i.e. associated with slots 9 and 10 of the ADPCM interface.

As the allocation of the devices is done by means of these synchronisation pulses, which are routed by means of the synchronism generator SYGEN, it is possible to have flexible and dynamic allocation; i.e. depending on which synchronisation pulse is received by each device, it is allocated one time slot or another. According to the invention, this permits that when two lines are involved in the same conversation (for example, a three-way conference with a cordless terminal), the devices that are engaged with it will have two consecutive time slots allocated, signifying that these devices access the same signal processor, e.g. receiving the synchronisation pulses FS1 and FS2 respectively, or else FS3 and FS4.

Thus the relative timing between PCM signals for processing coming from the two lines of communication, is fixed, making the task of the signal processor simpler and permitting less costly devices to be employed.

What is claimed is:

1. An Adaptive Differential Pulse Code Modulation/Pulse Code Modulation (ADPCM/PCM) coding interface for bidirectional digital communications channels, comprising a set of line coding devices of the bidirectional type, which incorporate ADPCM coders (COD), ADPCM decoders (DEC), analogue-to-digital converters (A/D), digital-to-analogue (D/A), signal processing means (MSP) and a synchronism generator (SYGEN), characterised in that all the outputs of the ADPCM decoders (DEC) and of the analogue-to-digital converters (A/D) are joined in a single PCM output bus (BPO), and in that all the input signals to the ADPCM coders (COD) and the input signals to the digital-to-analogue converters (D/A) are joined in a single PCM input bus (PI).

2. The interface according to claim 1, characterised in that all the line coding devices have an output signal indicating the presence of coding in the transmit path (TPE) and in the receive path (RPE), wherein all these output signal are likewise joined to form a code presence indication bus (PE).

3. The interface according to claim 2, characterised in that the signal processing means (MSP), which are formed by at least one signal processor (DSP), receive the PCM data coming from the ADPCM decoders (DEC) and from the analogue-to-digital converters (A/D) via the PCM output bus (BPO) and transmit signals with echo canceled via the PCM input bus (PI) to the ADPCM coders (COD) and to the digital-to-analogue converters (D/A), respectively.

4. The interface according to claim 1, characterised in that the synchronism generator (SYGEN) determines, by means of the distribution of synchronisation pulses (RAS), which initialize a data conversion process, in which time slot each line coding device has access to the different busses of said interface.

5. The interface according to claim 4, characterised in that when any two line coding devices are involved in the same conversation, the synchronism generator (SYGEN) allocates to them two consecutive time slots, in such a way that the channels with which they are concerned are processed by the same signal processor (DSP).

6. The interface according to claim 4, in that the PCM coding interface has six lines, lines 1, 2, 3, 4, 5 and 6, and that the ADPCM interface has time slots 1, 2, . . . . , 11, 12, of which time slots 1, 2, 5, 6, 9 and 10 of the ADPCM interface are respectively associated with said lines 1, 2, 3, 4, 5 and 6 of the PCM interface, thereby permitting collision-free operation on the busses used in this interface.

* * * * *